United States Patent [19]

Curtiss

[11] 4,445,080

[45] Apr. 24, 1984

[54] SYSTEM FOR INDIRECTLY SENSING FLUX IN AN INDUCTION MOTOR

[75] Inventor: William P. Curtiss, Winthrop, Mass.

[73] Assignee: The Charles Stark Draper Laboratory, Inc., Cambridge, Mass.

[21] Appl. No.: 324,769

[22] Filed: Nov. 25, 1981

[51] Int. Cl.³ .............................................. H02P 5/40
[52] U.S. Cl. .................................. 318/798; 318/806; 318/807; 324/158 MG
[58] Field of Search ........ 318/798, 803, 805, 807–811; 307/105; 324/222, 158 MG

[56] References Cited

U.S. PATENT DOCUMENTS

| | | | |
|---|---|---|---|
| 3,851,234 | 11/1974 | Hoffman et al. | 318/800 |
| 3,909,687 | 9/1975 | Abbondanti | 318/805 |
| 4,044,285 | 8/1977 | Plunkett et al. | 318/803 |
| 4,112,339 | 9/1978 | Lipo | 318/798 |
| 4,137,489 | 1/1979 | Lipo | 318/798 |

FOREIGN PATENT DOCUMENTS 664124 5/1979 U.S.S.R. ...................... 324/158 MG

Primary Examiner—David Smith, Jr.
Attorney, Agent, or Firm—Lahive & Cockfield

[57] ABSTRACT

Flux saturation in a current-excited induction motor is detected by sensing an accompanying increase in the level of the third harmonic in the waveform of the voltage across the stator windings. The level of the third harmonic relative to a fixed reference represents flux error. Nulling the flux error with a servo loop facilitates torque control by maintaining constant flux.

18 Claims, 7 Drawing Figures

SYSTEM FOR INDIRECTLY SENSING FLUX IN AN INDUCTION MOTOR

CROSS-REFERENCE TO RELATED APPLICATIONS

The subject matter of the present application is related to that in U.S. patent application Ser. No. 135,531, entitled "Induction Motor Controller With Balanced Excitation", filed Mar. 24, 1980, now U.S. Pat. No. 4,306,182. The foregoing cross-referenced application is incorporated herein by reference in its entirety.

BACKGROUND OF THE INVENTION

The invention relates generally to the field of induction motor controllers and particularly to systems for sensing flux indirectly and to control loops for induction motors which attempt to maintain constant flux.

The induction motor is essentially a transformer with its secondary short-circuited and free to move. The fixed primary windings, usually called stator windings or phase windings, are distributed about the axis of a rotor. Typically, the stator windings are interconnected so as to form multiple current paths, and alternating current of different phases of the same frequency is applied to the corresponding windings. The most widely used polyphase induction motor system utilizes three phase excitation.

The secondary conductors on the rotor of an induction motor form a closed circuit. To induce current in the rotor there must be relative motion between the stator flux vector and the rotor itself so that the rotor encounters changing flux. To meet this requirement, the excitation applied to the stator is controlled to establish a rotating flux vector which must in effect spin faster than the rotor. The difference between the stator excitation frequency, $\omega_s$, in radians per second and the mechanical frequency, $\omega_r$, representing the shaft speed times the number of pole pairs, is called slip or slip frequency $\omega$ and is the chief characteristic of all induction motors.

In the "squirrel cage" induction motor, the rotor conductors are spaced parallel bars which are arranged in a cylindrical cage. The bars are connected at the ends of the cage by conductive rings which are affixed to a coaxial shaft journalled for rotation within the stator. The manufacturing cost and maintenance are low for this configuration due to the absence of intricate windings and commutator assemblies for the rotor.

Historically, however, induction motors have been relegated primarily to fixed speed applications. With advances in semiconductor switching technology, it has now become feasible to provide reliable low cost alternating current sources of variable frequency. This ability to control stator current and excitation frequency simultaneously with high accuracy provides an opportunuty for enhanced control of the induction motor at varying speeds and loads. Because of the complicated interrelationship of torque, flux and slip frequency, however, it is difficult to control the torque output of an induction motor. As a result, many otherwise suitable variable speed applications, such as traction vehicles, elevators and servomotors have been left to the more easily controlled varieties of motors, particularly direct current motors. These other types of motors are far more expensive to manufacture and maintain since they require rotor windings and commutators, unlike the simple squirrel cage motor.

It is well known that flux regulation is one of the keys to optimum control of induction motors. Since maximum available torque is proportional to the square of the air gap flux level, it is desirable to operate the induction motor at peak flux in most applications. However, flux is a somewhat elusive function of current level, slip frequency, gap temperature and other parameters. Quasi "open loop" setting of the flux operating level without sensing flux can lead to expensive overdesign, i.e., selection of a motor larger and more expensive than actually required.

Flux can be directly sensed, for example by using Hall effect devices in the air gap between the rotor and the stator. Because this requires altering the motor itself, designing with Hall devices in the gap is costly. Moreover, Hall effect devices are temperature sensitive, exhibit histeresis effects and have very poor noise margin or sensitivity. Extra flux sensing windings which are sometimes used suffer similar disadvantages.

Indirect flux sensing has been attempted by integrating motor terminal voltages and subtracting out the anticipated voltage associated with the known resistance or "IR" drop due to stator current. This technique however requires unusually stable gain in the integrator and becomes inaccurate at low frequencies because of the inherent errors in any open loop IR drop cancellation technique.

SUMMARY OF THE INVENTION

Accordingly, one of the objects of the invention is to derive a signal which accurately represents air gap flux in an induction motor without modifying the motor. Another object of the invention is to generate an indirect flux error signal which can be utilized in a servo loop to maintain an optimum flux level.

A superior indirect flux sensing system has been discovered, which is applicable to any current-excited polyphase induction motor. Flux saturation is detected by sensing an accompanying increase in the level of the third harmonic in the waveform of the voltage across the phase windings of the stator. The relative level of the third harmonic represents a flux error. Nulling the flux error with a servo loop facilitates linear torque control of induction motors by maintaining constant flux. In one embodiment, the sum of the voltages across the individual phase windings of a three phase motor is integrated and filtered. The third harmonic in the filtered signal is detected and compared to a reference level to produce a flux error signal. The indirect flux error signal is used to alter the excitation of a three phase power supply so as to null the flux error. In one embodiment the flux error signal is used as a slip correction factor in a constant torque loop in which stator current is determined as a function of commanded torque.

DETAILED DESCRIPTION

Figure 1:
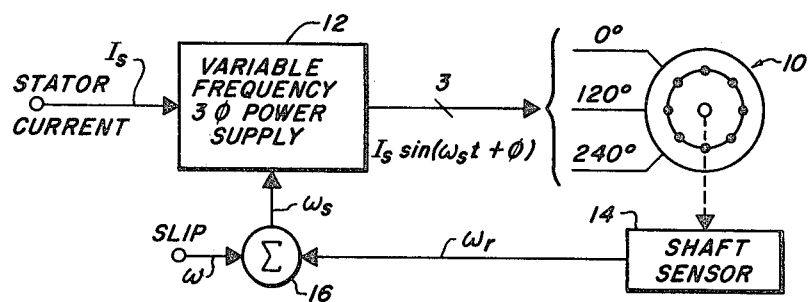
FIG. 1 is a block and schematic diagram of a conventional induction motor controller.

FIG. 1 shows the basic elements of one type of conventional induction motor controller. A three phase induction member 10, for example, a squirrel cage motor, is powered by a variable frequency three phase power supply 12 which produces alternating current in three equally spaced phases of the same frequency for respective windings of the stator of the motor 10. Induction motors are called either current excited or voltage-excited depending on whether the power source injects controlled current or applies controlled voltage. A current-excited mode is often preferred and is illustrated in FIG. 1. The variable frequency power supply 12 has a command input which represents the desired level of stator current. In this configuration, the induction motor itself is equipped with a shaft sensor 14 which measures the angular velocity of the rotor of the induction motor 10 and multiplies the velocity signal by the appropriate fixed number of pole pairs of the motor to produce a signal level representing the parameter $\omega_r$ known as the "mechanical frequency" of the motor. The signal $\omega_r$ is added to the desired slip signal $\omega$ in a conventional summing circuit 16. The output of summing circuit 16 is the stator excitation frequency signal $\omega_s$. The output frequency of the power supply 12 is determined by $\omega_s$ and results in the desired slip in the induction motor 10.

Figure 2:
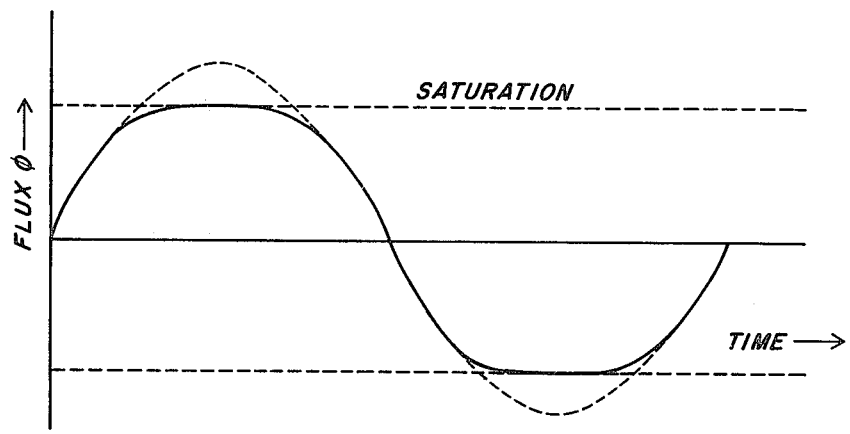
FIG. 2 is a graph of one period of flux variation as seen by a stator winding.

FIG. 2 illustrates one cycle of alternating flux level across the air gap produced by sinusoidally exciting a three phase induction motor as shown for example in FIG. 1. When the peak amplitude of the flux level is sufficiently below saturation of the motor material, the flux pattern will tend to be sinusoidal, as shown by the dashed curve in FIG. 2, because of the sinusoidal current excitation. Although the amplitude and phase of the motor flux and voltage across the windings are strongly dependent upon the slip frequency and will be different from the amplitude and phase of the stator current, the fundamental frequency of the flux will be the same as the excitation frequency. As the motor material approaches saturation, the flux tends to limit symmetrically for both positive and negative flux excursions as shown by the solid curve in FIG. 2. This symmetrical clipping pattern creates odd harmonics, i.e., third, fifth, seventh, etc., somewhat analogous to the harmonic content of a square wave. As the motor controller attempts to further increase the flux, the waveform becomes more truncated and the third harmonic becomes more prevalent. The signal strength in the third harmonic indicates the extent to which the controller is attempting to drive the flux level beyond saturation.

Figure 3:
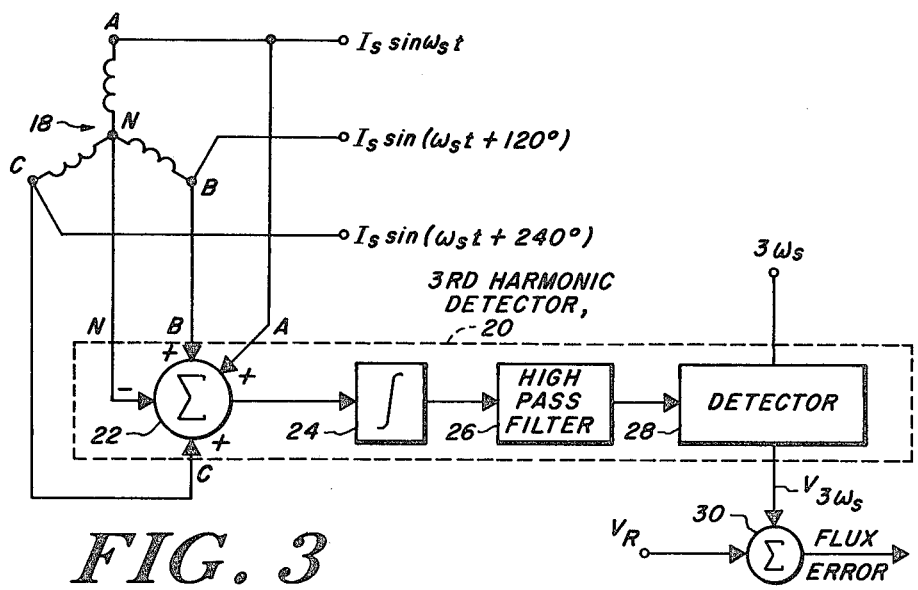
FIG. 3 is a block diagram of the flux error detector according to the invention.

FIG. 3 shows a "wye" connected three phase stator winding configuration 18 sinusoidally current excited, for example, with the balanced modulation technique disclosed in U.S. Pat. No. 4,306,182, incorporated by reference herein. The A, B, and C terminals for the 0, 120 and 240 degree phase windings, respectively, are connected to a third harmonic detector 20. The center tap or common terminal between the windings is also connected to the detector 20 so that the voltage across each winding can be measured. Any means for detecting the presence of third harmonic content of the voltage waveform across the stator windings will provide an indication of flux saturation.

Figure 4:
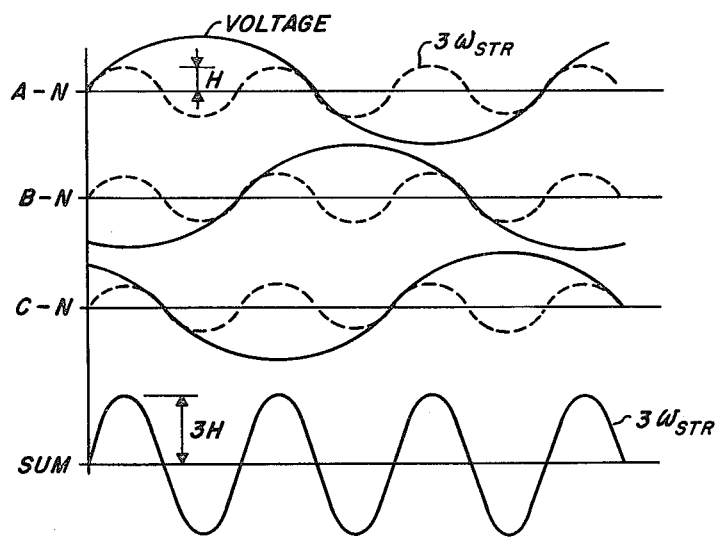
FIG. 4 is a compound waveform graph of the fundamental and harmonic content of the voltage across each of the three phase windings showing the sinusoidal fundamental and sinusoidal third harmonic waveforms, with the bottom waveform representing the sinusoidal sum of all of the above signals.

In the preferred system shown in FIG. 3, the third harmonic detector 20 includes a conventional analog summing circuit 22 for producing an output signal representing the sum of the voltages across the three windings 18. The result of this operation is illustrated in FIG. 4. Because the phase difference among the original current excitations is preserved in the voltage waveforms developed across the stator windings, the sinusoidal fundamentals of these waveforms cancel in the summing circuit.

The sinusoidal third harmonic is of course in phase with its associated fundamental so that the negative peak of the third harmonic coincides with the positive peak of the fundamental. Since the phase difference between the fundamentals corresponds to the entire period of the third harmonic, the third harmonics do not cancel but "interfere" constructively. The result is a sinusoidal sum waveform having an amplitude three times that of the third harmonic content of each stator winding voltage and a frequency corresponding to the third harmonic, i.e., $3\omega_s$.

The output of the summing circuit 22 in FIG. 3 is then passed to integrator 24 which keeps the amplitude of the output harmonics constant as a function of frequency at a fixed operating flux level.

The resistive voltage drops across the stator windings can be ignored. Since a sinusoidal current drive is used, the series resistance voltage drop is at the fundamental frequency. The resistances of each phase are nominally equal, and the summing technique also tends to cancel these fundamentals. More importantly, the IR drop is immune to flux saturation and thus the resistive terms do not affect the harmonic output of the integrator 24.

In some applications the output of the summing circuit 22 or the integrator 24 may be sufficiently free of noise to be useful as a measure of a third harmonic indicative of flux saturation. However, in other applications the integrator output may have to be processed to eliminate the effect of any fundamental leak-through voltages which might occur due to imperfect balancing. Direct current voltage and all even harmonic voltage components should also be rejected. One operation that exhibits these properties is to process the output of the integrator 24 through a high pass filter 26 followed by a detector 28 which provides the DC output signal indicative of the signal strength at the third harmonic as shown in FIG. 3. The purpose of the filter is to reject the leak-through fundamental at low speed operation. The reference frequency for the detector 28 is obtained by tripling the excitation frequency $\omega_s$ which, of course, is a variable frequency. The output of the detector 28 is then passed to a summing circuit 30 which provides a flux error signal output by comparing the output of the detector 28 to a reference voltage level, $V_R$.

Figure 5:
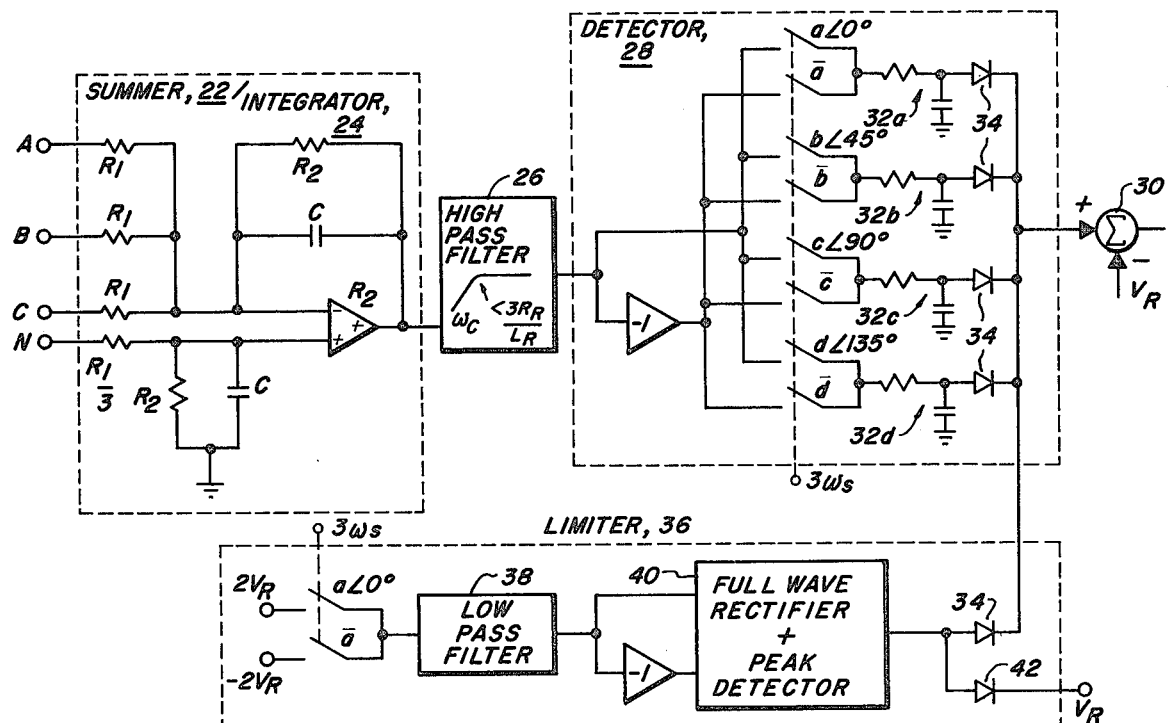
FIG. 5 represents a specific embodiment of the third harmonic sensor of FIG. 3.

FIG. 5 illustrates a presently preferred embodiment of the third harmonic detector 20 of FIG. 3 in which the summing circuit 22 and integrator 24 are provided by a single operational amplifier configuration. The output of the operational amplifier is passed to a high pass filter 26 whose cutoff frequency $\omega_c$ is less than three times the ratio of the rotor resistance to the rotor inductance, that is, below the third harmonic of the rotor break frequency or natural frequency.

The output of the high pass filter 26 is passed to a multiphase synchronous detector 28 having four synchronous detector sections phased 45 degrees apart from each other. The reason a multiphase detector must be used is that the phase of the flux and voltage across the windings is strongly dependent upon slip and differs from the phase of the corresponding stator excitation current. The switches a,b,c and d and their complements are all operated by a square wave signal at the third harmonic of the excitation frequency phased 45 degrees apart from each other, respectively. Thus, the first RC circuit 32a will be connected to the output of the high pass filter 26 for half of a cycle at $3\omega_s$ and to the inverted output of the filter 26 for the other half of the cycle. If the output of the filter 26 is at the same frequency and same phase as the square wave operating complementary switches a and $\bar{a}$, the RC circuit will become charged to a maximum level corresponding to the amplitude of the third harmonic. Likewise, if the harmonic content of the output of the filter 26 is at the same frequency and phase as the square wave driving the b, $\bar{b}$ switches, RC filter 32b will become charged to a maximum level corresponding the amplitude of the third harmonic. The same principle governs the other RC filters 32c and 32d. The RC circuits will receive more or less powder depending on how close the phase of the output of the filter 26 matches the phase of the square wave driving the corresponding set of switches. The outputs of the RC circuits 32a–32d are peak detected by an array of parallel connected diodes 34 each having its input in series with the output of the respective RC filters 32a–32d. The highest output among the RC circuits is passed to the summing circuit 30 for comparison with a reference level $V_R$.

A limiter circuit 36 includes a low pass filter 38 whose input is a square wave switched between plus $2V_R$ and minus $2V_R$ at same frequency and phase as the RC filter section 32a. The output of the low pass filter 38 is passed with its complement to the full wave rectifier and peak detector 40 which produces a DC output level unless the switching frequency is above the low pass cutoff. A clamping diode 42 limits the output of the detector 40 to $V_R$ and the limited output is peak detected along with the four synchronous detectors' outputs. The object of the limiter circuit 36 is to provide a nulling output signal equal to $V_R$ when the excitation frequency is below a specified value. This signal keeps the summing circuit 30 mulled at frequencies at or below the cutoff frequency of the high pass filter 26 so that a flux error signal is not generated in this frequency region.

To insure that flux errors due to temperature uncertainties in the rotor break frequency, i.e., the inverse of rotor time constant, do produce a flux error signal, the cut-off of the high pass filter 26 should be set well below the lowest possible rotor break frequency.

The system of FIG. 5 exhibits plus or minus 4% amplitude variation with phase angle due to the use of only four synchronous detectors. Of course, more detector sections more closely spaced in phase could further reduce this uncertainty if required. Using fewer detection sections, however, is also a possibility. For example, if two synchronous detectors are phased 90 degrees apart, their output can be vector summed by the outputs of each detector, adding the squared outputs and taking the square root of the sum. The resulting DC output would not vary with phase angle. It also would not vary if the final square root operation is not performed.

In place of the high pass filter and synchronous detector arrangement, the output of the integrator 24 can be processed by a tracking bandpass filter set at the third harmonic. The tracking filter is implemented with a switched capacitor filter system in which the switches are driven at three times the motor excitation frequency. The resultant signal is then full wave rectified and filtered.

In the FIG. 5 filter system, the integrator output is sequentially switched to an array of compacitor filters with each individual filter's output peak detected relative to the others. Each switch is operated at three times the fundamental frequency. With many switch sections, the output and amplitude variations with phase would be negligible. This mechanization also avoids the need for squaring elements.

The DC output of detector 28 (FIG. 3) is then compared against an appropriate voltage reference $V_R$. The error signal, if any, indicates a deviation from a desired flux operating level. The voltage reference level sets the desired flux operating level because the amplitude of the third harmonic is strongly related (although nonlinearly) to the flux level. A known flux level (detected by other measuring equipment) versus detector level calibration curve can be prepared for a given motor and used for selection of the voltage reference $V_R$ to designate an optimum operating flux level. The motor would normally be operated at very high flux levels thus generating strong odd harmonic terms.

A balanced modulation current excitation system is described in detail in U.S. Pat. No. 4,306,182. The balanced modulation system insures sinusoidal excitation of the stator windings by using pulse modulation systhesis of a reference sine wave. Using balanced modulation helps lower the leak-through fundamental.

Figure 6:
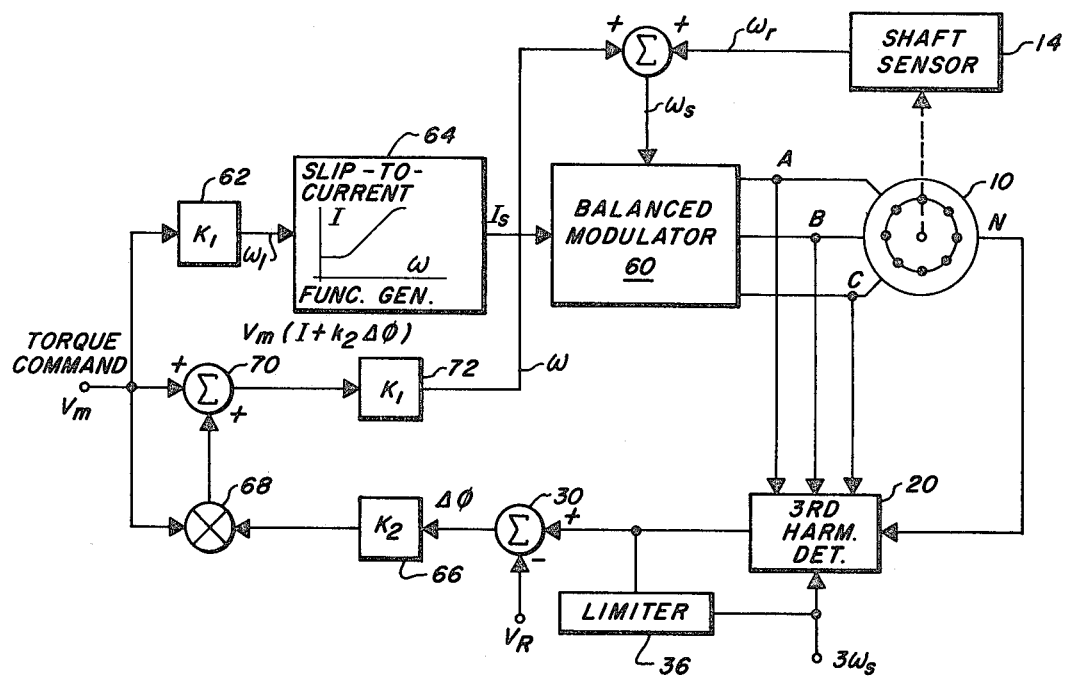
FIG. 6 is a schematic and block diagram of another linear torque loop in which stator current is a function of commanded slip with flux correction according to the invention.

In the system of FIG. 6, torque is commanded by producing a level $V_m$ from which both slip and stator current are derived. The torque signal is multiplied by a proportionality constant $k_1$ in amplifier 62 and presented as the input to a slip to-current function generator 64. The generator 64 generates an output to the modulator 60 which roduces stator current $I_s$ according to the formula:

$$I_s = \frac{N\Phi}{L}\left[\frac{(\omega_1 T_R)^2 + 1}{(1 - K^2)^2(\omega_1 T_R)^2 + 1}\right]^{\frac{1}{2}},$$

where $T_R$ is the nominal rotor time constant (inverse of rotor break frequency), K represents the rotor-to-stator coupling coefficient and $\omega_1$ is slip as represented by the torque command $V_m$ multiplied by $K_1$. The denominator of the radical is practically unity since the coupling coefficient is typically greater than 0.95. The stator current output of the function generator 64 forms the amplitude command signal to the balanced modulation current excitation system 60. The torque command signal $V_m$ can be used directly as the slip command to the excitation system and the flux will be nominally constant. However, in the system of FIG. 6, flux error, if any exists, is used as a correction factor for the commanded slip. When flux error is detected due to changes in the rotor time constant, for example, the error signal is multiplied by proportionality constant $K_2$ in amplifier 66 and passed to a multiplier 68 which also receives the torque command signal $V_m$. The output of the multiplier 68 is $V_m K_2 \Delta\Phi$, where $\Delta\Phi$ is the flux error referenced to $V_R$. The multiplier output is added to the original torque signal $V_m$ in summing circuit 70. The output of the summing circuit 70 is multiplied by proportionality constant $K_1$ is amplifier 72 to produce a signal $K_1 V_m (1 + K_2 \Delta\Phi)$ representing the corrected slip. When there is no flux error signal, for example, at frequencies below the high pass cut-off, this expression reduces to $K_1 V_m$. The stator current amplitude $I_s$ in any case is unaffected by the flux error.

The average value of the amplified flux error signal while operating in the high pass frequency range, effectively represents the gain change required to adapt the slip frequency to the changing rotor time constant $T_R$, which is temperature dependent and can represent a major source of error. The average value of this gain change signal can be "remembered" and used while the loop is operating at frequencies below the high pass cut-off where the flux loop is in effect disengaged. Thus gain can also be corrected in the low frequency range. The "remembered" correction factor can be deliberately decayed during the time when the motor is not operating or the frequencies are very low. The rate of decay would nominally correspond to the exponential rate of temperature decay when the motor is not dissipating power for example, when it is turned off. This function can be implemented capacitively for example, as a time constant of decay.

Figure 7:
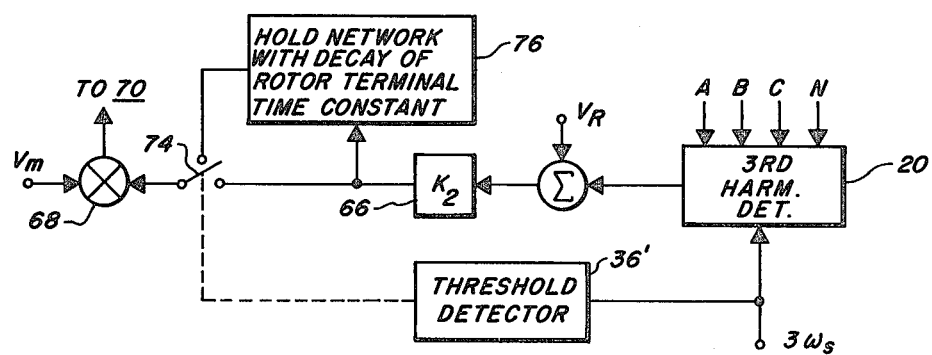
FIG. 7 is a partial block diagram of a modification to the system of FIG. 6.

FIG. 7 illustrates the functional requirements of such a system. Note that in FIG. 7 the limiter 36 used in FIG. 5 is replaced by a frequency threshold detector 36'. Instead of nulling the output of the summing circuit 30 by introducing a compensating term, the detector 36' holds open a switch 74 thereby eliminating the true flux error signal at low frequencies. The switch 74 is closed (down) when the input frequency exceeds the threshold value. This alternate limiting technique is also applicable to the embodiment of FIG. 5. The amplified input to the multiplier 68 is accumulated and averaged by a hold network 76 which operates to supply a substitute for the missing flux error signal at low frequency and start-up conditions when switch 74 is in the "up" condition. If this adaptive technique of remembering is incorporated into the system, the high pass filter 26 (FIGS. 3–5) can be set to an even higher frequency which helps reject the leak-through fundamental. Thus proper gain adjustment for slip excitation is remembered so that flux control is preserved even when a true flux error signal is not available.

The indirect flux sensing system disclosed herein offers the advantage of flux regulation, one of the keys to induction motor control, independent of extraneous sensing equipment such as shaft sensors, Hall effect devices and sense coils. The use of the third harmonic characteristic of flux saturation provides an ideal method of regulating flux at saturation levels where torque is maximum. Moreover, the system is relatively immune to noise because saturation is accompanied by severe clipping which produces a relatively strong third harmonic component. The system is particularly compatible with a balanced modulation sinusoidal current excitation system, but can be used with other types of polyphase variable frequency power supplies. Indirect flux sensing encloses the design of linear torque loops which do not have to rely on direct sensing of torque, shaft speed or flux. A low cost squirrel cage motor can have linear torque control that is implemented entirely by low cost electronic circuitry.

The foregoing description is intended to be illustrative rather than restrictive. The scope of the invention is indicated by the appended claims, and all variations or modifications coming within the range of equivalents are intended to be embraced therein.

I claim:

1. An indirect flux sensor for an n phase AC motor system having a rotor and a stator with stator windings energized by a variable frequency n phase power source, comprising
   means connected to said stator windings for detecting a characteristic of the voltage waveform across the windings indicative of flux saturation,
   wherein said detecting means includes means for detecting a substantial increase in the level of the third harmonic of the fundamental voltage waveform across at least one of the windings characteristic of flux saturation,
   wherein said means for detecting an increase in the level of the third harmonic includes summing means connected to the windings for producing the algebraic sum of the voltages across each of the windings such that the fundamental voltage waveforms cancel and the third harmonics are reinforced due to their phase relationship,
   wherein said means for detecting an increase in the level of the third harmonic further includes means for making the output amplitude of said summing means independent of frequency.

2. The flux sensor of claim 1, wherein said means for making the output amplitude independent includes means for integrating the output for said summing means.

3. The flux sensor of claim 2, wherein said means for detecting an increase in the level of the third harmonic further includes high pass filter means responsive to the output of said integrating means for passing substantially only signals having frequencies in excess of a first threshold level.

4. The flux sensor of claim 3, wherein the first threshold level is less than three times the minimum rotor break frequency inherent in the rotor.

5. The flux sensor of claim 4, wherein said means for detecting an increase in the level of the third harmonic further includes means responsive to the output of said high pass filter for detecting the amplitude of the third harmonic.

6. The flux sensor of claim 5, wherein said means for detecting the amplitude of the third harmonic includes multiple phase synchronous detector means set at three times the variable excitation frequency and responsive to a plurality of phases for producing an output indicative of the amplitude at the third harmonic.

7. The flux sensor of claim 5, wherein said means for detecting the amplitude of the third harmonic includes four synchronous detectors set 45 degrees apart in phase respectively and detector means for passing the highest amplitude output among the outputs of the synchronous detectors.

8. A control system for an induction motor having stator windings energized by a variable frequency power source,
   comprising means for producing a flux saturation signal, means for producing a flux error signal indicative of the difference between said flux saturation signal and a reference level, and control loop means responsive to said flux error signal for maintaining constant flux in said motor by tending to null the flux error, wherein said flux saturation signal producing means includes means connected to said stator windings for detecting a characteristic of the voltage waveform across stator windings indicative of flux saturation, wherein said detecting means includes means for producing a flux signal indicative of a predetermined harmonic content in the voltage waveform across said stator windings, wherein said detecting means includes means for detecting a substantial increase in the level of the third harmonic of the fundamental voltage across the stator windings characteristic of flux saturation, wherein said means for detecting an increase in the level of the third harmonic includes summing means connected to the windings for producing the algebraic sum of the voltages across each of the windings such that the fundamental voltage waveforms cancel and the third harmonics are reinforced due to their phase relationship, wherein said means for detecting an increase in the level of the third harmonic further includes means for making the output amplitude of said summing means independent of frequency.

9. A control system for an induction motor having a stator with n stator windings energized by a variable frequency, variable amplitude power supply and means for producing a current control signal as a function of a torque command signal and means for establishing the stator excitation frequency as a function of said torque command and shaft speed of the rotor of the induction motor, wherein the improvement comprises means for producing a signal indicative of the level of flux in said induction motor, means for producing a flux error signal indicative of the difference between said flux level signal, and a reference level, and means for changing the slip of said motor in accordance with said flux error signal so as to null said flux error, wherein said means for producing a flux level signal includes means for producing a flux saturation signal, wherein said means for producing a flux saturation signal includes means for detecting a characteristic of the voltage waveform across the stator windings indicative of flux saturation, wherein said detecting means includes means for producing a flux signal indicative of a predetermined harmonic content in the voltage waveform across said stator windings, wherein said detecting means includes means for detecting a substantial increase in the level of the third harmonic of the fundamental voltage across the stator windings characteristic of flux saturation, wherein said means for detecting an increase in the level of the third harmonic includes summing means connected to the windings for producing the algebraic sum of the voltages across each of the windings such that the fundamental voltage waveforms cancel and the third harmonics are reinforced due to their phase relationship, wherein said means for detecting an increase in the level of the third harmonic further includes means for making the output amplitude of said summing means independent of frequency.

10. The flux sensor of claims 8 or 9, wherein said means for making the output amplitude independent includes means for integrating the output for said summing means.

11. The flux sensor of claim 10, wherein said means for detecting an increase in the level of the third harmonic further includes high pass filter means responsive to the output of said integrating means for passing substantially only signals having frequencies in excess of a first threshold level.

12. The flux sensor of claims 1 or 8 or 9, further comprising error signal means for producing an error signal indicative of a difference between a reference level and an output of said detecting means.

13. The flux sensor of claim 12, further comprising limiter means responsive to the excitation frequency of the power source for nulling said error signal output when the excitation frequency is below a predetermined second threshold.

14. The flux sensor of claim 13, wherein said second threshold corresponds to said first threshold.

15. The flux sensor of claim 14, wherein said limiter means includes means for applying to said error signal means a signal equal to said reference level.

16. The flux sensor of claim 13, wherein said limiter means includes means for disabling the output of said error signal means.

17. The flux sensor of claim 16, further comprising thermal decay means responsive to said limiter means for providing a substitute error signal representing the most recent error signal with an amplitude decaying at a rate corresponding to the thermal time constant inherent in the rotor.

18. An indirect flux sensor for an n phase AC motor system having a rotor and a stator with stator windings energized by a variable frequency n phase power source, comprising means connected to said stator windings for detecting a characteristic of the voltage waveform across the windings indicative of flux saturation, wherein said detecting means includes means for detecting a substantial increase in the level of the third harmonic of the fundamental voltage waveform across at least one of the windings characteristic of flux saturation, and further comprising error signal means for producing an error signal indicative of a difference between a reference level and an output of said detecting means, limiter means responsive to the excitation frequency of the power source for nulling said error signal output when the excitation frequency is below a predetermined second threshold, wherein said limiter means includes means for disabling the output of said error signal means, and thermal decay means responsive to said limiter means for providing a substitute error signal representing the most recent error signal with an amplitude decaying at a rate corresponding to the thermal time constant inherent in the rotor.

* * * * *